United States Patent
Yoon (10) Patent No.: US 7,643,361 B2
(45) Date of Patent: Jan. 5, 2010

(54) REDUNDANCY CIRCUIT CAPABLE OF REDUCING TIME FOR REDUNDANCY DISCRIMINATION

(75) Inventor: Hyuck Soo Yoon, Ichon (KR)

(73) Assignee: Hynix Semiconductor, Inc. (KR)

( * ) Notice: Subject to any disclaimer, the term of this patent is extended or adjusted under 35 U.S.C. 154(b) by 14 days.

(21) Appl. No.: 11/959,414

(22) Filed: Dec. 18, 2007

(65) Prior Publication Data

US 2008/0279018 A1 Nov. 13, 2008

(30) Foreign Application Priority Data

May 10, 2007 (KR) .................... 10-2007-0045408

(51) Int. Cl.
*G11C 11/00* (2006.01)
(52) U.S. Cl. .................. 365/200; 365/230.03
(58) Field of Classification Search ............... 365/200, 365/230.03
See application file for complete search history.

(56) References Cited

U.S. PATENT DOCUMENTS 5,337,277 A * 8/1994 Jang .......................... 365/200
6,807,121 B2 10/2004 Natsui et al.

2007/0002656 A1 1/2007 An
2007/0041260 A1 2/2007 Hong et al.

FOREIGN PATENT DOCUMENTS

| JP | 07-211097 | 8/1995 |
|---|---|---|
| JP | 2003-323798 | 11/2003 |
| JP | 2005-116106 | 4/2005 |
| JP | 2006-073041 | 3/2006 |
| KR | 100172431 | 10/1998 |
| KR | 1020020041549 A | 6/2002 |
| KR | 1020020061124 A | 7/2002 |

\* cited by examiner

*Primary Examiner*—Michael T Tran
(74) *Attorney, Agent, or Firm*—Baker & McKenzie LLP (57) ABSTRACT

A redundancy circuit in a semiconductor memory apparatus includes a comparison signal receiving unit to receive a plurality of comparison signals and a fuse enable signal in parallel, wherein the comparison signals are generated by comparing a plurality of row address signals to a plurality of fuse address signals; and a redundancy control signal generating unit for providing a redundancy control signal by controlling an output signal path of the comparison signal receiving unit in response to a signal level of a row address enable signal. The comparison signal receiving unit receives the plurality of the comparison signals and the fuse enable signal while the row address enable signal is activated.

30 Claims, 8 Drawing Sheets

FIG.1

(PRIOR ART)

REDUNDANCY CIRCUIT CAPABLE OF REDUCING TIME FOR REDUNDANCY DISCRIMINATION

CROSS-REFERENCES TO RELATED APPLICATION

The present application claims priority under 35 U.S.C. 119(a) to Korean application number 10-2007-0045408, filed on May 10, 2007, in the Korean Patent Office, which is incorporated by reference in its entirety as if set forth in full.

BACKGROUND

1. Technical Field

The embodiments described herein relate to semiconductor memory apparatus and, more particularly, to circuits and methods for controlling an activation of a redundancy word line in a semiconductor memory apparatus.

2. Related Art

Generally, when a semiconductor memory apparatus has a few, or even just one defective memory cell, the memory apparatus will not be able to perform the necessary storage operations, and will be regarded as a bad product. Accordingly, redundancy technology, which uses supplementary memory cells in place of defective cells, has been employed in conventional semiconductor memory apparatus.

In conventional apparatus, after the completion of the wafer fabricating processes, a device test is carried out and repair of defective memory cells is performed through fuse cutting. In other words, to provide defect relief, a redundancy circuit containing fuses that can, e.g., be melted using a high-energy light such as laser, is manufactured together with the memory cell and circuit devices of the semiconductor memory apparatus. The address information associated with the defective memory cell, that is, address information for the fuse cutting can be stored and the defective memory cells can be replaced with redundant memory cells in a redundancy cell area by fusing the appropriate fuses in the redundancy circuit.

In a conventional memory device, the memory cells are often arrange into blocks, which can be termed sub-array blocks. There can be a redundancy circuit for each sub-array block, such that if there is a defect in one or more of the cells in a particular sub-array, the sub-array block, or certain cells therein can be replaced with redundancy cells under the control of the associated redundancy circuit. Alternatively, an integrated redundancy circuit can be used for multiple sub-array blocks. For example, a conventional redundancy circuit may comprise an address comparator and a discrimination circuit. For example, the address comparator can be dedicated to each sub-array block and can receive fuse address signals for the replacement of memory cells within the associated sub-array block. The external address signals are compared with the fuse address signals in order to allow access the appropriate redundancy cells. When there is a match between the external address and the fuse array signal, then the redundancy wordlines associated with the appropriate redundancy cells are activated allowing access to the redundancy cells.

Figure 1:
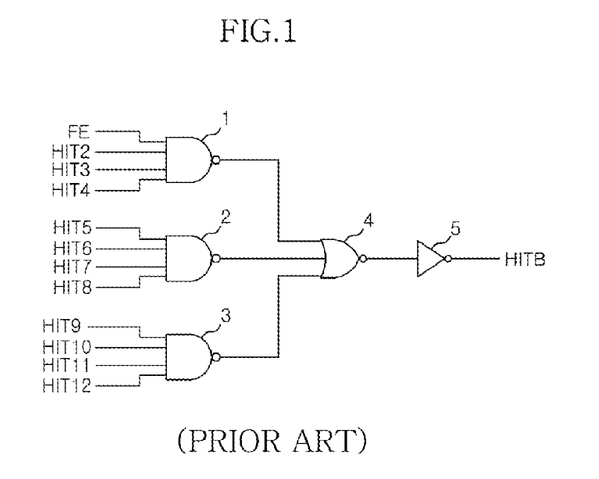
FIG. 1 is a block diagram illustrating an exemplary redundancy discriminating unit.

Referring to FIG. 1, an exemplary discrimination circuit has a plurality of NAND gates 1 to 3 that receive a fuse enable signal FE and a plurality of comparison signals HIT2 to HIT 12, a NOR gate 4 to combine outputs of the plurality of NAND gates 1 to 3 and an inverter 5 to invert an output of the NOR gate 4. A redundancy control signal HITB is generated by the discrimination circuit based on the plurality of the comparison signals HIT2 to HIT12. The defective memory cell is replaced with a redundancy cell based on the results of the address comparison unit and the discrimination circuit. In other words, word lines of the redundancy cell array can be activated or inactivated in accordance with the result of the discrimination performed by the discrimination circuit.

Unfortunately, the access time to the semiconductor memory apparatus can be increased due to the delay time that is required to compare the address signals and perform the discrimination. Particularly, in cases where the discrimination circuit is composed of logic combination circuits having a plurality of series-stages to receive a plurality of signals, as is often the case, the discrimination time is delayed while the signals are transferred through each stage. Further, it is not sufficient to simply operate the circuit at high speed because the redundancy control signal is generated after the comparison signals are received and the turn-on operations are progressively carried out via each stage. The series-stages architecture also brings the added disadvantage that it increases layout area requirements.

SUMMARY

A redundancy circuit can generate a redundancy control signal with a high-speed discrimination, which increases access time, i.e., reduces delay. Moreover, more efficient layout can be achieved that reduces the footprint and increases layout efficiency for the memory cell.

According to one aspect, a redundancy circuit in a semiconductor memory apparatus comprises a comparison signal receiving unit to receive a plurality of comparison signals and a fuse enable signal in parallel, wherein the comparison signals are produced by comparing a plurality of row address signals to a plurality of fuse address signals, and a redundancy control signal generating unit for providing a redundancy control signal by controlling an output signal path of the comparison signal receiving unit in response to a signal level of a row address enable signal.

The comparison signal receiving unit can be configured to receive the plurality of comparison signals and the fuse enable signal, when the row address enable signal is activated. Further, the comparison signal receiving unit can include a plurality of switching elements that are connected in parallel with each other in order to receive in parallel the plurality of the comparison signals and the fuse enable signal. The switching elements can be PMOS or NMOS transistors. In the case where the switching elements are all NMOS transistors, at least one of the switching elements electrically couples the output signal path of the comparison signal receiving unit to a voltage terminal having a ground voltage level in response to the deactivation of at least one of the plurality of the comparison signals and the fuse enable signal. In the case where the switching elements are all PMOS transistors, at least one of the switching elements electrically couples the output signal path of the comparison signal receiving unit to a voltage terminal having a power supply voltage level in response to the deactivation of at least one of the plurality of the comparison signals and the fuse enable signal.

Meanwhile, the comparison signal receiving unit can be in a floating state when the fuse enable signal and the plurality of the comparison signals are activated.

The redundancy control signal generating unit can be coupled to a ground voltage level or a power supply voltage level of the semiconductor memory apparatus. The redundancy control signal generating unit can be configured to provide the redundancy control signal by controlling a transmission path of a supply voltage in response to an activation of the row address enable signal. The redundancy control signal generating unit can be configured to provide the redundancy control signal by controlling the output signal path of the comparison signal receiving unit in response to deactivation of the row address enable signal which is inactivated.

The redundancy control signal generating unit can include an inverting unit having switching elements that are selectively turned on and off in response to an activation of the row address enable signal; and a latch unit to provide the redundancy control signal in response to an output signal of the inverting unit.

Here, the row address signal is a valid signal while the row address enable signal is activated.

According to another aspect, a redundancy circuit in a semiconductor memory apparatus comprises a comparison signal receiving unit to receive a plurality of comparison signals and a fuse enable signal in parallel, wherein the comparison signals are generated by comparing a plurality of row address signals to a plurality of fuse address signals, and a redundancy control signal generating unit for blocking an output signal path of the comparison signal receiving unit when a row address enable signal is activated and generating a redundancy control signal while the a row address enable signal is inactivate.

According to still another aspect, a redundancy circuit in a semiconductor memory apparatus comprises an address comparison unit for comparing a plurality of row address signal to a plurality of fuse address signal and then providing a plurality of comparison signals, and a redundancy discriminating unit for receiving a fuse enable signal and the plurality of comparison signals and activating a redundancy word line by using a redundancy control signal, which is triggered by a transition timing of a row address enable signal. The redundancy discriminating unit can include a comparison signal receiving unit having a plurality of switching elements that are connected in parallel to each other to receive in parallel the plurality of comparison signals and the fuse enable signal, and a redundancy control signal generating unit for providing a redundancy control signal, being triggered by deactivation of the row address enable signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 3b is a block diagram illustrating a unit address comparator included in the address comparison unit illustrated in FIG. 3a.

FIG. 5b is a timing diagram of the row address enable signal in FIG. 5a.

DETAILED DESCRIPTION

According to the embodiments described herein, a redundancy control for signal for replacing a defective memory cell with a redundancy cell can be generated quickly and efficiently. A fuse address signal and an external address signal are provided in parallel and used to control the result of a discrimination operation. As such, the discrimination time can be reduced by determining an output time of comparison signals using a simple control scheme.

Figure 2:
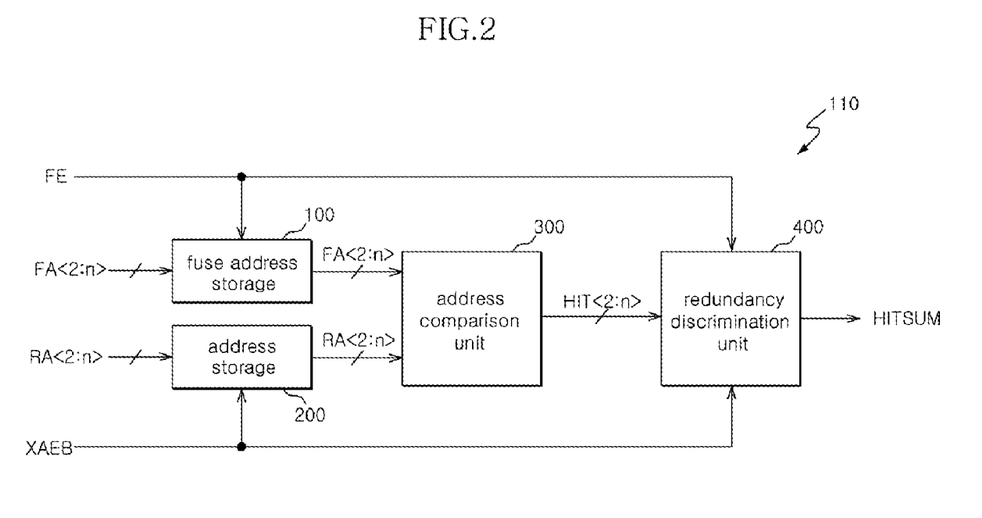
FIG. 2 is a block diagram illustrating a redundancy circuit in accordance with one embodiment.

FIG. 2 is a block diagram illustrating an example redundancy circuit 110 in accordance with one embodiment. As can be seen, the redundancy circuit 110 can include a fuse address storage 100, an address storage 200, an address comparison unit 300 and a redundancy discrimination unit 400. The fuse address storage 100 can be controlled by a fuse enable signal FE and can be configured to store fuse address signal FA<2:n>. The fuse address information provided via fuse address signal FA<2:n> will be based on the required fuse cutting of a corresponding defective memory cell.

More specifically, when a defective memory cell is detected from a cell array test performed on a semiconductor memory apparatus, the address information of the defective memory cell is programmed into the fuse address storage 100. This causes fuses to be cut in order to program the position information of the defective memory cell.

Depending on the embodiment, the fuse cutting can be achieved, e.g., via an electric fuse cutting in which the appropriate fuses are melted using over-current, a laser fuse cutting in which a laser beam is used to melt the appropriate fuses, and a junction short-circuiting operation, which also uses a laser beam.

The address storage 200 can be configured to receive and store row address signal RA<2:n> from an external circuit in response to a row address enable signal XAEB. The row address enable signal XAEB can be a signal that indicates the row address signal RA<2:n> is a valid address signal during the activation thereof.

The address comparison unit 300 can be configured to receive the fuse address signal FA<2:n> and the row address signal RA<2:n> and then generate comparison signal HIT<2:n>. More specifically, the address comparison unit 300 can be configured to compare the fuse address signal FA<2:n> with the row address signal RA<2:n> and determine whether they match. If they do match, then the address comparison unit 300 can be configured to enable, or activate the comparison signal HIT<2:n>. That is, the activated comparison signal HIT<2:n> can be information that indicates the bits of input row address signal RA<2:n> are matched with the bits of fuse address signal FA<2:n>, which means the input row address signals RA<2:n> correspond to the position information of the defective memory cell.

In this example, the signals comprise n−1 bits, i.e., the bits range form 2 to n. But it will be understood that more or less bits can be used.

The redundancy discriminating unit 400 according to one embodiment provides a control signal HITSUM after receiving the comparison signal HIT<2:n> and performing a discrimination operation to determine whether associated redundancy word lines should be activated. More specifically, the redundancy discriminating unit 400 can be configured to control the activation of the appropriate redundancy word lines by providing the control signal HITSUM based on the transition timing of the row address enable signal XAEB.

Figure 3A:
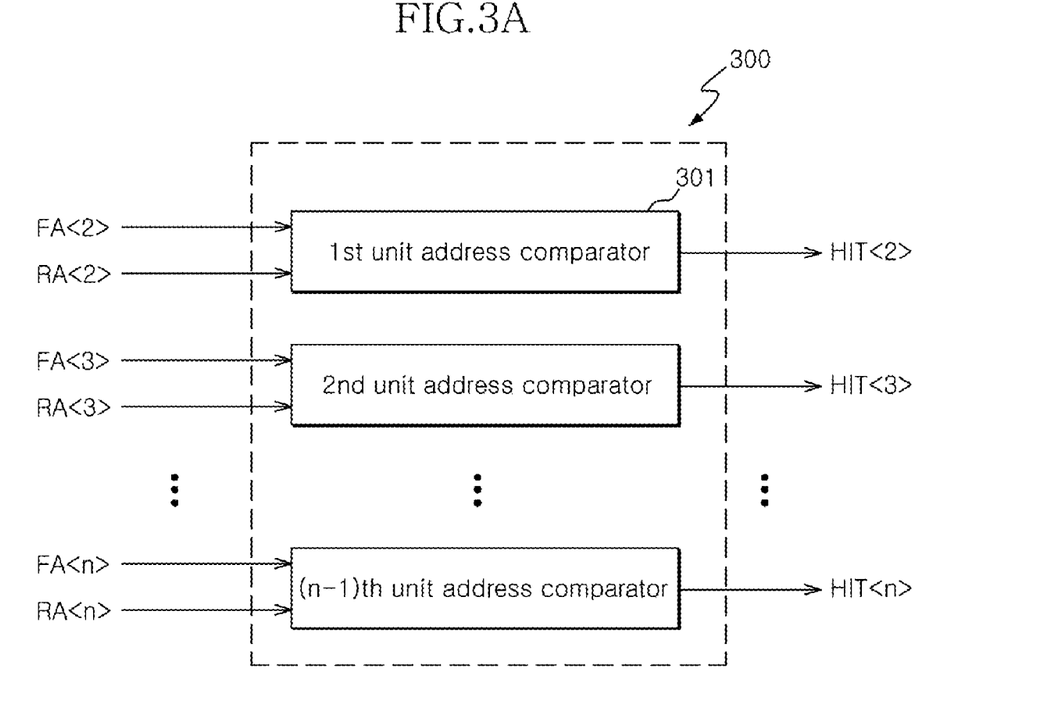
FIG. 3a is a block diagram illustrating an address comparison unit included in the circuit illustrated in FIG. 2.

FIG. 3a is a block diagram illustrating the address comparison unit 300 of FIG. 2 in more detail. As mentioned above, the address comparison unit 300 can be configured to compare the row address signals RA<2:n> to the fuse address signals FA<2:n>. The address comparison unit 300 can comprise a plurality of sub-array blocks. Also, as illustrated, the address comparison unit 300 can include a plurality unit address comparators 301. For example, the address comparison unit 300 can include a separate unit address comparator for each bit of the fuse address signal FA<2:n> and row address signal RA<2:n>, which are provided to address comparison unit 300 in parallel as illustrated. The unit address comparators 301 can then be configured to compare a row address signal bit RA<i> to a corresponding fuse address signal bit FA<i>, where i is an integer with a value from 2 to n. For example, a first unit address comparator 301 can be configured to compare a second fuse address signal bit FA<2> with a second row address signal bit RA<2> and to provide the comparison signal HIT<2> as the result of the comparison.

Figure 3B:
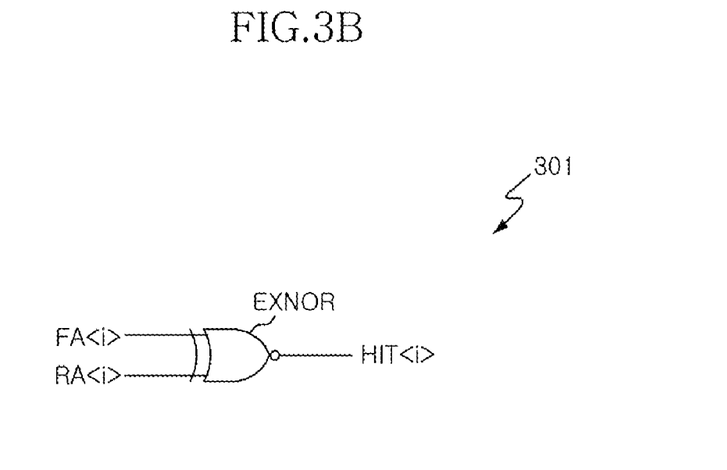

FIG. 3b is a block diagram illustrating an example implementation of the unit address comparator 301 in FIG. 3a. The unit address comparator 301, of FIG. 3b, includes an exclusive-NOR gate EXNOR. The exclusive-NOR gate EXNOR receives the row address signal bit RA<i> and the fuse address signal bit FA<i> corresponding to the row address signal bit RA<i> and then provides the comparison signal bit HIT<i>. The unit address comparator 301 can be configured to provide an active comparison signal bit HIT<i> at a high voltage level when the row address signal bit RA<i> and the fuse address signal FA<i> match.

Figure 4:
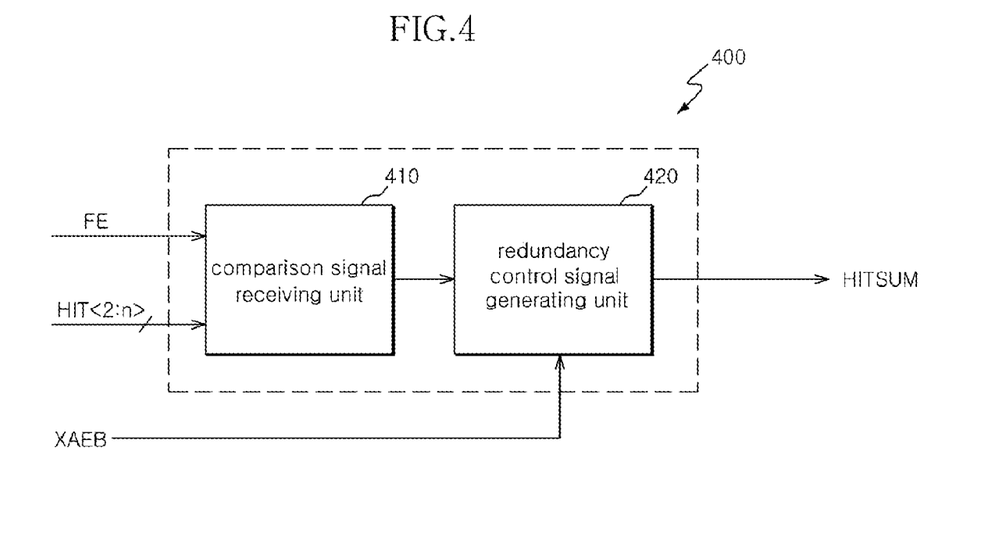
FIG. 4 is a block diagram illustrating a redundancy discriminating unit included in the circuit illustrated in FIG. 2.

FIG. 4 is a block diagram illustrating an example implementation of the redundancy discriminating unit 400 illustrated in FIG. 2. As can be seen, the redundancy discriminating unit 400 can include a comparison signal receiving unit 410 and a redundancy control signal generating unit 420. The comparison signal receiving unit 410 can be configured to receive the fuse enable signal FE and the bits of the comparison signal HIT<2:n> in parallel. By doing so, the result of the discrimination on the fuse enable signal FE and the plurality of the comparison signals HIT<2:n> can be achieved in one step as opposed to requiring several stages.

The redundancy control signal generating unit 420 can be configured to provide the redundancy control signal HITSUM by blocking an output signal from the comparison signal receiving unit 410 when the row address enable signal XAEB is active and transferring the output signal from the comparison signal receiving unit 410 to an output terminal when the row address enable signal XAEB is not active. In other words, the redundancy control signal HITSUM can be selectively provided based on the logic level of the row address enable signal XAEB.

It should be noted that sufficient time required to receive the fuse enable signal FE and the plurality of the comparison signals HIT<2:n> in parallel in the comparison signal receiving unit 410 is provided while the row address enable signal XAEB is active. When the row address signal XAEB is deactivated, then the redundancy control signal HITSUM can be generated based on the output from the comparison signal receiving unit 410.

Figure 5A:
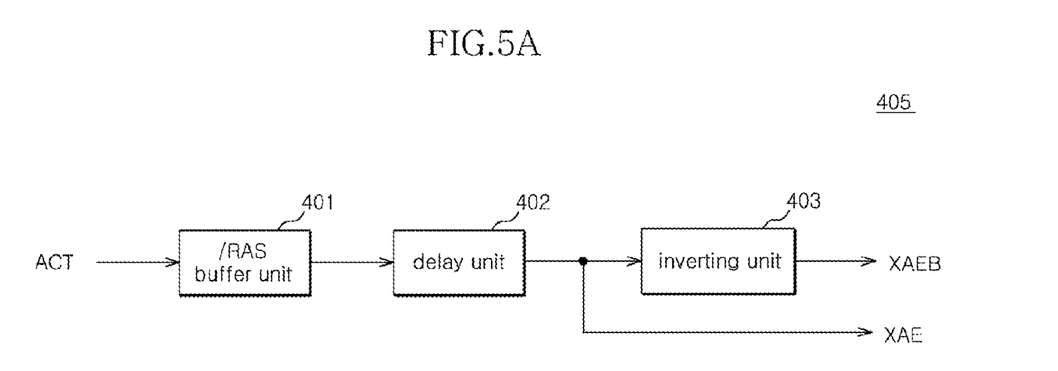
FIG. 5a is a block diagram illustrating a generation of a row address enable signal for use with the circuit of FIG. 2.
Figure 5B:
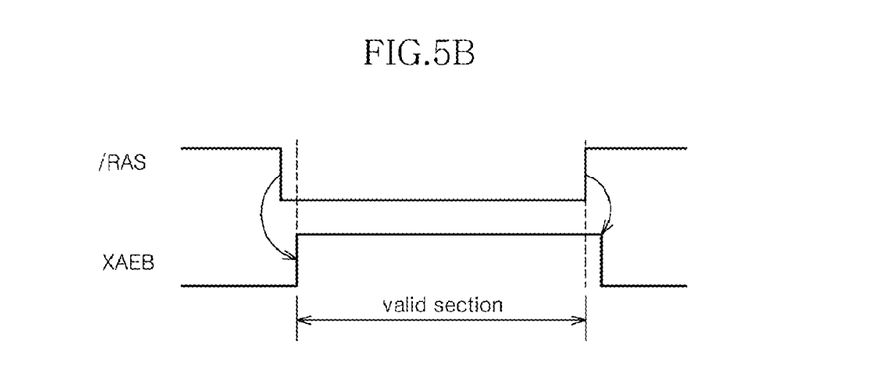

Referring to FIGS. 5a and 5b, the operations of a row address enable signal generating unit 405 configured to generate the row address enable signal XAEB will be described. First, referring to FIG. 5a, the row address enable signal generating unit 405 can include a /RAS buffer unit 401, a delay unit 402 and an inverting unit 403. The /RAS buffer unit 401 can be configured to provide an activated /RAS signal when an external command ACT is received. The row address enable signal XAEB can be generated by delaying the /RAS signal for a predetermined time and then inverting it. These operations can be provided via the delay unit 402 and the inverting unit 403, respectively. Further, a delayed row address enable signal XAE can be provided in certain embodiments. The amount of delay provided by delay unit 402 can vary depending on the requirements of a particular embodiment.

FIG. 5b is diagram illustrating the timing associated with the row address enable signal XAEB. As can be seen, the row address enable signal XAEB is produced by delaying and inverting the /RAS signal. Here, the row address enable signal XAEB is activated in a logic-high level. The row address signals, which are received while both the row address enable signal XAEB and the /RAS signal are simultaneously active, can be defined as valid address signals.

Figure 6:
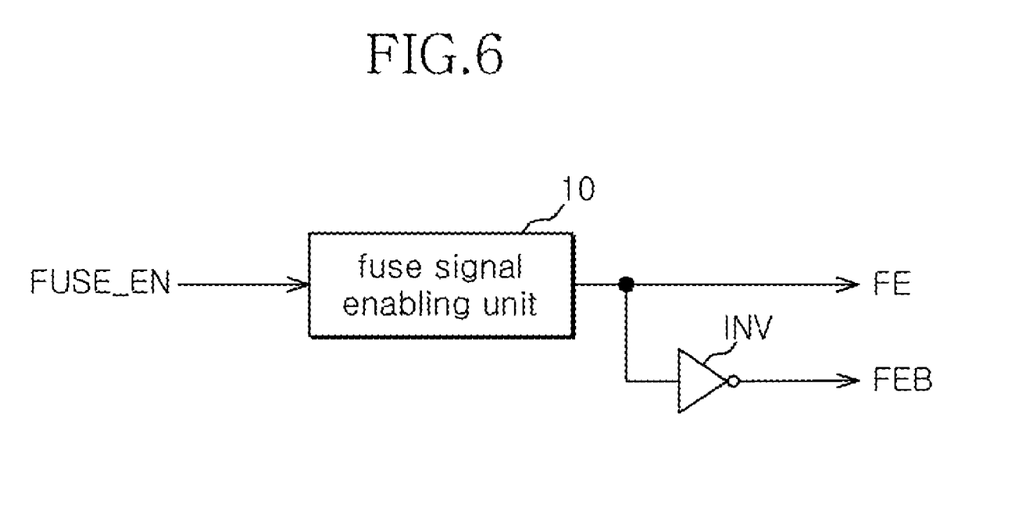
FIG. 6 is a block diagram illustrating a fuse signal generating unit in accordance with one embodiment.

FIG. 6 shows a fuse signal generating unit having a fuse signal enabling unit 10. The fuse signal enabling unit 10 can be configured to provide the fuse enable signals FE and FEB. The FEB signal can be generated by receiving a fuse enable pulse signal FUSE_EN and inverting the fuse enable pulse signal FUSE_EN. The fuse enable signal FE is generated by cutting a fuse. In the present example, the fuse enable signal FE is in a logic-high level when active.

Figure 7:
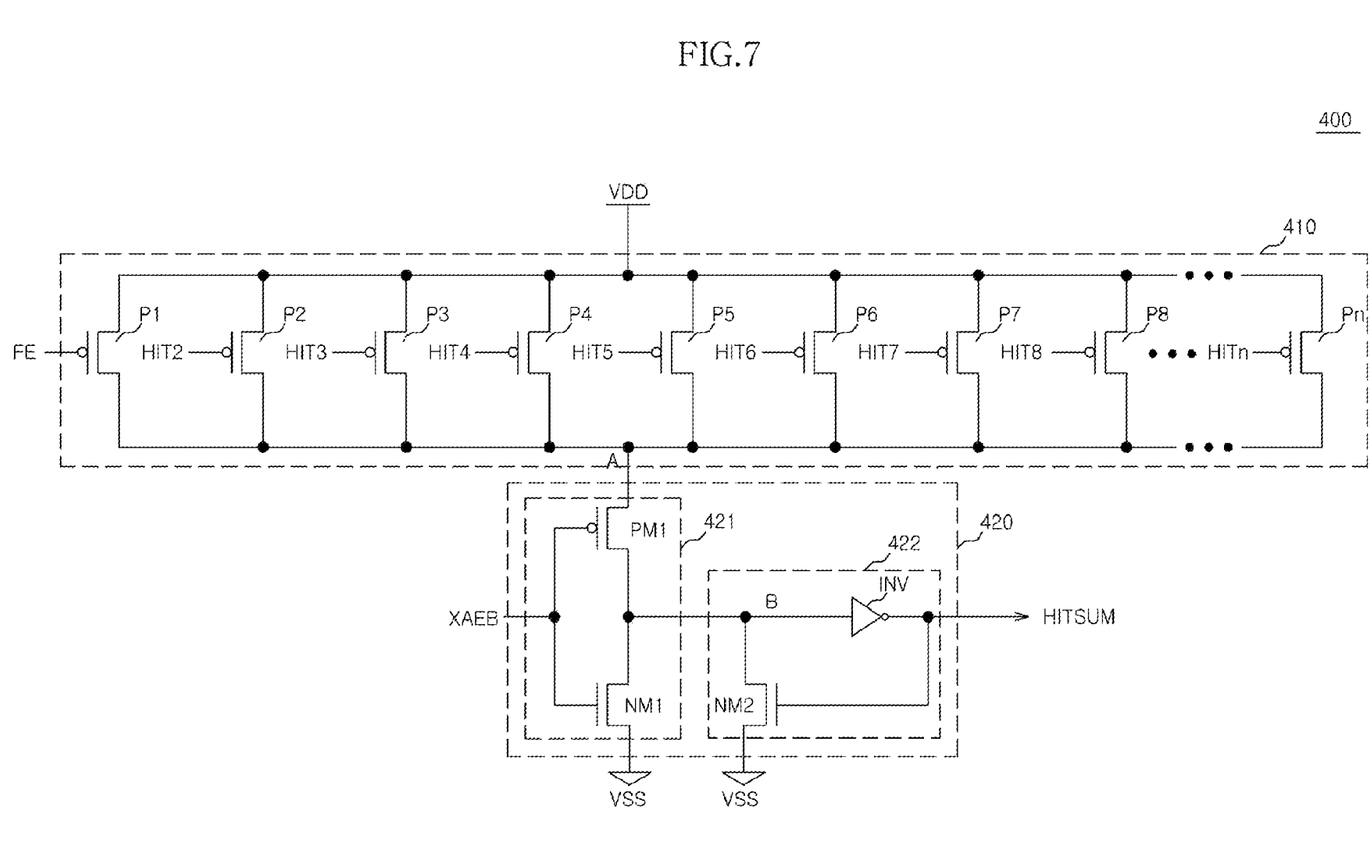
FIG. 7 is a detailed circuit diagram illustrating a more detailed view of the redundancy discriminating unit of FIG. 2.

FIG. 7 is a block diagram illustrating a more detailed view of an example implementation of the redundancy discriminating unit 400 that includes a comparison signal receiving unit 410 and a redundancy control signal generating unit 420. The comparison signal receiving unit 410 can include a plurality of switching elements P1 to Pn, which are connected in parallel with each other and which receive the fuse enable signal FE and the plurality of the comparison signals HIT<2:n>. The switching elements P1-Pn can be made up of NMOS or PMOS transistors; however, in the example of FIG. 7, the switching elements P1-Pn use PMOS transistors.

As mentioned above, the fuse enable signal FE and the plurality of comparison signals HIT<2:n> will be in a logic-high level when active. The comparison signal receiving unit 410 provides the supply voltage (hereinafter, referred to as "VDD") to node A when at least one of the fuse enable signal FE and the plurality of comparison signals HIT<2:n> is inactive, e.g., at a logic-low level. In other words, when the fuse enable signal FE goes low and one of the switching elements P1-Pn receives a low level comparison signal bit H<i>, then that switching element will pull node A up to VDD. The other switching elements P1-Pn, will be in a floating state. Further, the comparison signal receiving unit 410 can be configured to operate only while the row address enable signal XAEB is enabled.

The redundancy control signal generating unit 420, which provides the redundancy control signal HITSUM in response to a logic level of the row address enable signal XAEB, can include an inverting unit 421 and a latch unit 422. The inverting unit 421 can include a first PMOS transistor PM1 and a first NMOS transistor NM1, which are turned on and off in response to the row address enable signal XAEB. The latch unit 422 can include an inverter INV and a second NMOS transistor NM2 to latch an output signal of the inverting unit 421.

Referring to FIG. 7, the operation of the redundancy discriminating unit 400 according to one embodiment of the present invention will be described.

First, in the case where the row address signal (RA<2:n> in FIG. 2) matches the fuse address signals (F<2:n> in FIG. 2), i.e., the address signal RA<2:n> is associated with a defective cell, then the comparison signal receiving unit 410 receives an active fuse enable signal FE and an active comparison signal HIT<2:n>, e.g., the fuse enable signal FE and the bits of the comparison signal HIT<2:n> are at a logic high level. Thus, the switching elements P1-Pn in the comparison signal receiving unit 410 are turned off so that the comparison signal receiving unit 410 is in a floating state. Since the comparison signal receiving unit 410 receives all the signals in parallel while the row address enable signal XAEB is activated. The comparison signal receiving unit 410 can generate the result of the comparison at a high speed.

In other words, the row address signals (RA<2:n> in FIG. 2) are received while the row address enable signal XAEB is activated. Also, while the row address enable signal XAEB is activated, the address comparison unit (reference numeral 200 in FIG. 2) compares the row address signals (RA<2:n> in FIG. 2) to the fuse address signal FA<2:n> and then generates the comparison signal HIT<2:n>. The bits of the comparison signal HIT<2:n> and the fuse enable signal FE are received in parallel by the comparison signal receiving unit 410. The bits of the comparison signal HIT<2:n> and the fuse enable signal FE, turn on or off the parallel-connected switching elements P1 to Pn based on their logic level thereby influencing the voltage on node A.

When the inverting unit 421 receives the row address enable signal XAEB in a logic-high level, e.g., the row address enable signal XAEB is active, then the first NMOS transistor NM1 is turned on. Therefore, the output of the comparison signal receiving unit 410 is blocked while the row address enable signal XAEB is active. Accordingly, the first NMOS transistor NM1 is turned on and node B is in a logic-low level. As a result, the redundancy control signal HITSUM is provided in a logic-high level via the inverter INV and is held at this level via latch unit 422.

Conversely, when the row address enable signal XAEB is received in a logic-low level, i.e., is disabled or deactivated, then, the PMOS transistor PM1 in the inverting unit 421 is turned on, and NMOS transistor NM1 is turned off, and the voltage signal on node A is passed to the inverter INV in latch unit 422. As mentioned above, when the comparison signal receiving unit 410 is in the floating state, a low level signal will appear on node B in the latch unit 422. This low level signal is inverted and the inverted signal is then output as the redundancy control signal HITSUM, i.e., the redundancy control signal HITSUM is provided in a logic-high level, which will activate the appropriate redundancy word lines.

In the case where at least one switching element in the comparison signal receiving unit 410 is turned on and the VDD voltage level is then applied to node A, then the VDD voltage level on node A will be applied to node B through the first PMOS transistor PM1 when the row address enable signal XAEB is deactivated. This will deactivate the redundancy control signal HITSUM by causing it to go low.

Figure 8:
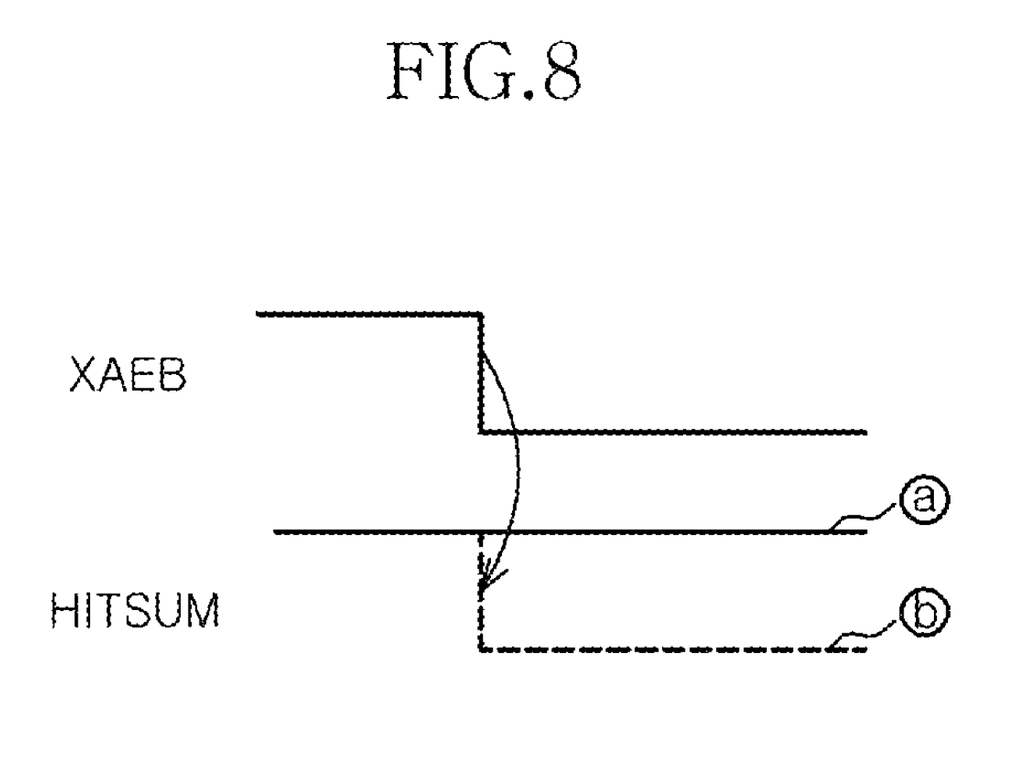
FIG. 8 is a timing diagram of a row address enable signal and a redundancy control signal generated or used in the circuit illustrated in FIG. 7.

FIG. 8 is a timing diagram illustrating the relation between the row address enable signal XAEB and the redundancy control signal HITSUM. As noted, the redundancy word line activation is discriminated by the signal level of the redundancy control signal HITSUM. In FIG. 8, (a) is a signal showing the redundancy control signal HITSUM, which is activated in a logic-high level and therefore activates the redundancy word lines, and (b) is a signal showing the redundancy control signal HITSUM going low when the row address enable signal XAEB goes low, provided the fuse enable signal FE and the bits of the comparison signal HIT<2:n> are high, which deactivates the redundancy word lines.

Figure 9:
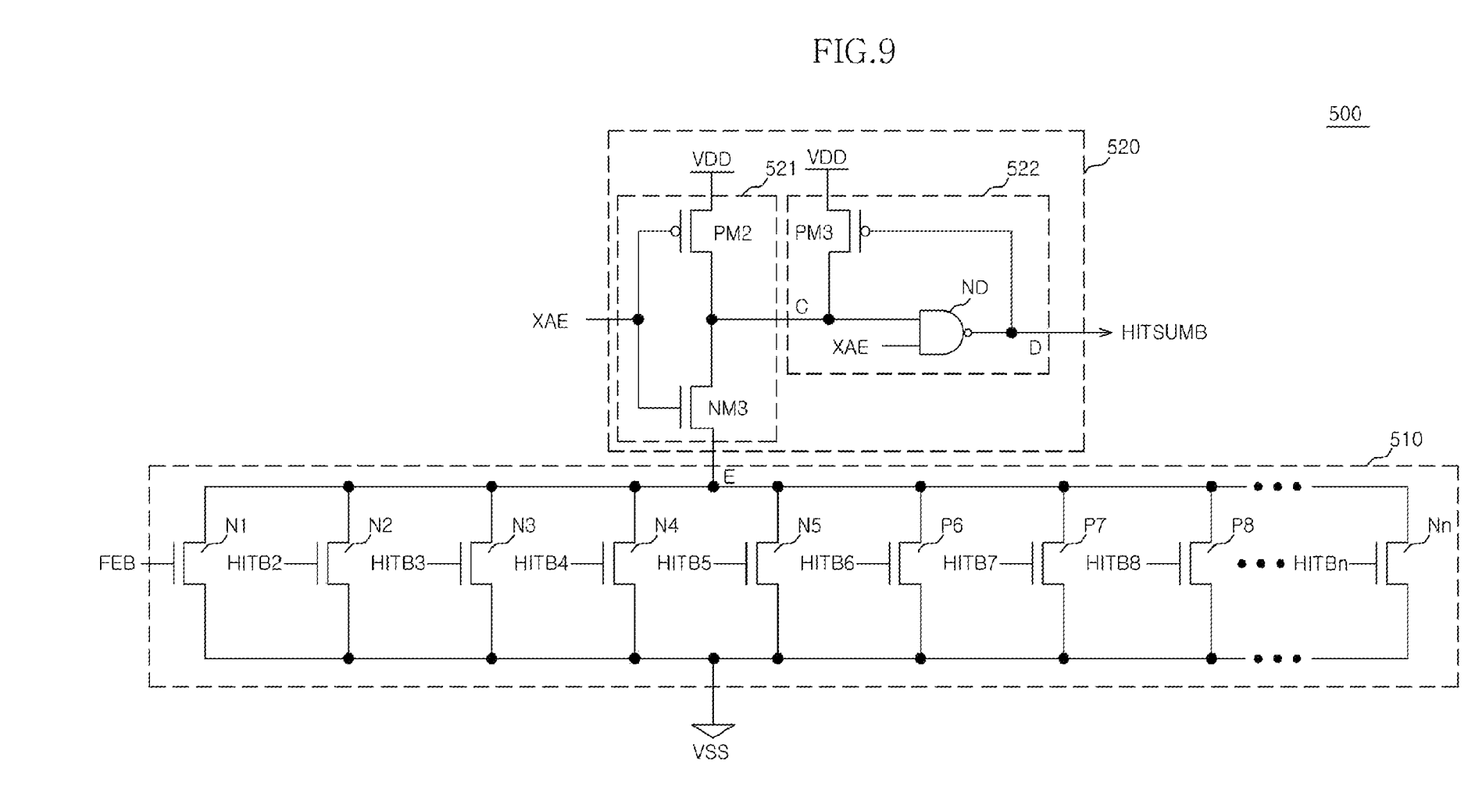
FIG. 9 is a detailed circuit diagram illustrating a redundancy discriminating unit in accordance with another embodiment.

FIG. 9 is a detailed circuit diagram illustrating the redundancy discriminating unit 500 in accordance with another embodiment. The redundancy discriminating unit 500 includes a comparison signal receiving unit 510 and a redundancy control signal generating unit 520.

In this embodiment, all switching elements N1 to Nn in the comparison signal receiving unit 510 are made up of NMOS transistors and the VDD voltage is applied to the redundancy control signal generating unit 520. Functions of the signals in FIG. 9 are the same as those in FIG. 7, just having a difference in the activation level. In other words, the fuse enable signal FEB, the comparison signal HITB, the row address enable signal XAE and the redundancy control signal HITSUMB operate the same, but are inverted compared to the descriptions above.

Thus, the comparison signal receiving unit 510 still receives the comparison signals HITB<2:n> in parallel while the row address enable signal XAE is activated.

If address signals corresponding to a defective memory cell are received as the row address signals RA<2:n>, they will then coincided with the fuse address signals FA<2:n>. Accordingly, the fuse enable signal FEB of a logic-low level and the activated comparison signals HITB<2:n> are received so that all the switching elements N1 to Nn are turned off and node E is in a floating state.

Meanwhile, when an inverting unit 521 in the redundancy control signal generating unit 520 receives the address activation signal XAE, which is activated in a logic-low level, a second PMOS transistor PM2 is turned on and VDD voltage signal is then applied to node C.

A NAND gate ND in a latch unit 522 provides the redundancy control signal HITSUMB of a logic-high level, since the row address enable signal XAE is at a logic-low level, regardless of the voltage signal on node C. After a predetermined time, when the row address enable signal XAE transitions to a logic-high level, then a third NMOS transistor NM3 is turned on and the voltage signal is delivered to node E. As described above, in the case where the row address signals corresponding to a defective memory cell are received, then the node E will be floating. Therefore, the redundancy control signal generating part 520 can provide the redundancy control signal HITSUMB based on the operation of the NAND gate ND receiving the deactivated row address enable signal XAE and the voltage signal on the node C.

That is, the redundancy control signal HITSUMB is provided at a high level, which has been already applied to node C, and the operation of the NAND gate ND to receive the row address enable signal XAE of a logic-low level. The activated redundancy control signal HITSUMB, which is triggered at the time of the inactivation of the row address enable signal XAE, activates the redundancy word lines. Moreover, the activate redundancy control signal HITSUMB, e.g., comprising a logic-low level, can be continuously provided by the redundancy control signal generating unit 520, while the row address enable signal XAE is inactive.

However, when row address signals RA<2:n> related to normal memory cells is received, they will not match the fuse address signals FA<2:n>. In this case, at least one of the switching elements N1-Nn, which receives a high level comparison signals HITB<i>, is turned on pulling node E to VSS. In this case, the third NMOS transistor NM3 is turned on according to the operation of the redundancy control signal generating unit 520 and node C will also go to a logic-low level. This will cause the redundancy control signal HITSUMB to go to a logic-high level, thereby inactivating the redundancy word lines.

Figure 10:
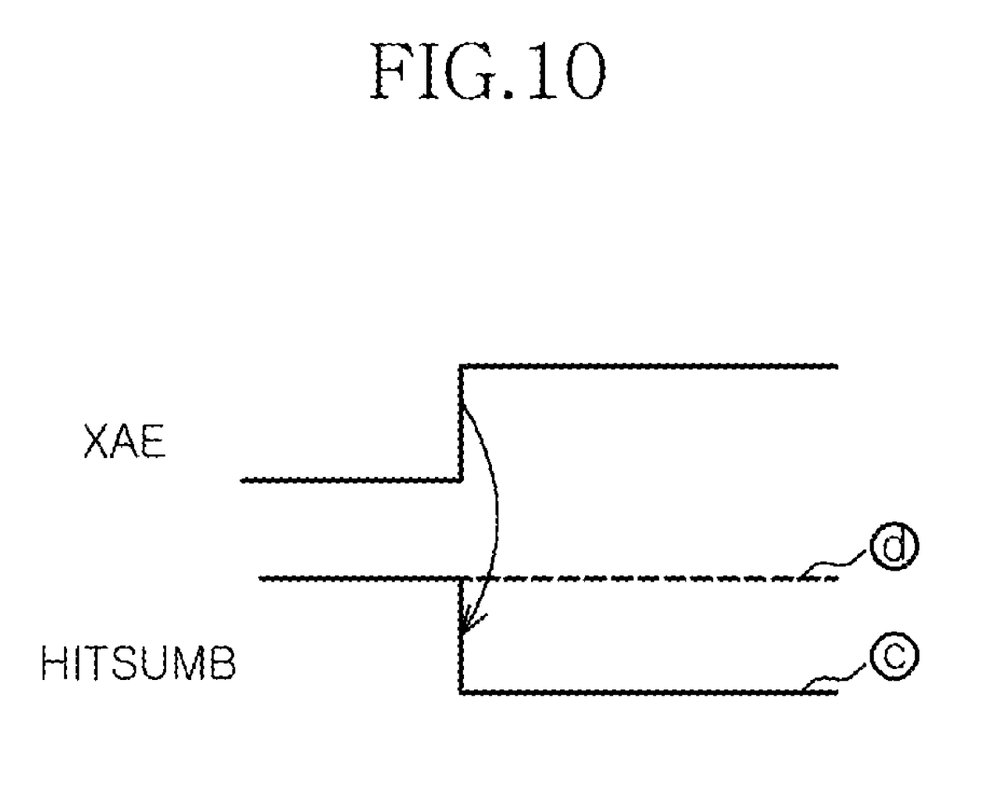
FIG. 10 is a timing diagram of a row address enable signal and a redundancy control signal generated or used in the circuit illustrated in FIG. 9.

FIG. 10 is a timing diagram showing the relation between the row address enable signal XAE and the redundancy control signal HITSUMB for the circuit of FIG. 9.

Here, the row address enable signal XAE is a signal which is active in a logic-low level and inactive in a logic-high level. Therefore, the redundancy control signal HITSUMB is maintained in a logic-high level while the row address enable signal XAE is activated. Next, the activated redundancy control signal HITSUMB ((d) in FIG. 10) is produced at the time of the deactivation of the row address enable signal based on the result of the comparison signal receiving unit 510. The redundancy word lines can be activated by the activation of the redundancy control signal HITSUMB. Further, the deactivated redundancy control signal HITSUMB ((c) in FIG. 10) occurs when XAE goes high and as a result of the operation of the comparison signal receiving unit 510. An inactive redundancy control signal HITSUMB means that the redundancy word lines are inactive as well.

Thus, it is possible that the output signal for the redundancy operation is provided by receiving the comparison signals in parallel, while the row address signals are activated, without using series-connected circuits to continuously receive the comparison signals. As a result, the time for the discrimination of redundancy can be reduced to the delay associated with a the signal path in the comparison signal receiving unit based on the timing of the inactivation of the row address enable signal. Moreover, the layout can be effectively improved by including the switching elements corresponding to each address signals, instead of complicated combination circuits.

As illustrated in detail above, the redundancy control signal to replace the defective memory cell with the redundancy cell can be provided at a high speed. Further, since the comparison signals of the fuse address signals and the external address signals are received in parallel and a processing result of the paralleled received comparison signals is outputted based on a predetermined timing, the time for discriminating the redundancy can be reduced with a simple determination of output timing of the comparison signals.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A redundancy circuit in a semiconductor memory apparatus, comprising:
    a comparison signal receiving unit to receive a plurality of comparison signals and a fuse enable signal in parallel, wherein the comparison signals are generated by comparing a plurality of row address signals to a plurality of fuse address signals; and
    a redundancy control signal generating unit for providing a redundancy control signal by controlling an output signal path of the comparison signal receiving unit in response to a signal level of a row address enable signal, wherein the comparison signal receiving unit is in a floating state when the fuse enable signal and the plurality of the comparison signals are activated and then received.

2. The redundancy circuit of claim 1, wherein the comparison signal receiving unit receives the plurality of the comparison signals and the fuse enable signal while the row address enable signal is activated.

3. The redundancy circuit of claim 1, wherein the comparison signal receiving unit comprises a plurality of switching elements which are in parallel with each other in order to receive in parallel the plurality of the comparison signals and the fuse enable signal in parallel.

4. The redundancy circuit of claim 3, wherein the switching element are PMOS or NMOS transistors.

5. The redundancy circuit of claim 4, wherein the switching elements are all NMOS transistors and wherein at least one of the switching elements electrically couples the output signal path of the comparison signal receiving unit to a voltage terminal having a ground voltage level in response to the deactivation of at least one of the plurality of the comparison signals and the fuse enable signal.

6. The redundancy circuit of claim 4, wherein the switching elements are all PMOS transistors and wherein at least one of the switching elements electrically couples the output signal path of the comparison signal receiving unit to a voltage terminal having a power supply voltage level in response to the deactivation of at least one of the plurality of the comparison signals and the fuse enable signal.

7. The redundancy circuit of claim 1, wherein the redundancy control signal generating unit is coupled to a ground voltage level or a power supply voltage level of the semiconductor memory apparatus.

8. The redundancy circuit of claim 1, wherein the redundancy control signal generating unit provides the redundancy control signal by controlling a transmission path of a supply voltage in response to an activation of the row address enable signal, and the redundancy control signal generating unit provides the redundancy control signal by controlling the output signal path of the comparison signal receiving unit in response to deactivation of the row address enable signal.

9. The redundancy circuit of claim 1, wherein the redundancy control signal generating unit comprises:
    an inverting unit having switching elements which are selectively turned on and off in response to an activation of the row address enable signal; and
    a latch unit to provide the redundancy control signal in response to an output signal of the inverting unit.

10. A redundancy circuit in a semiconductor memory apparatus, comprising:
    a comparison signal receiving unit to receive a plurality of comparison signals and a fuse enable signal in parallel, wherein the comparison signals are generated by comparing a plurality of row address signals to a plurality of fuse address signals; and
    a redundancy control signal generating unit for blocking an output signal path of the comparison signal receiving unit when a row address enable signal is activated and generating a redundancy control signal while the a row address enable signal is inactivated,
    wherein the redundancy control signal generating unit comprises:
    an inverting unit having switching elements which are selectively turned on and off in response to an activation of the row address enable signal; and
    a latch unit to provide the redundancy control signal in response to an output signal of the inverting unit.

11. The redundancy circuit of claim 10, wherein the comparison signal receiving unit receives the plurality of the comparison signals and the fuse enable signal while the row address enable signal is activated.

12. The redundancy circuit of claim 10, wherein the comparison signal receiving unit comprises a plurality of switching elements which are in parallel with each other in order to receive in parallel the plurality of the comparison signals and the fuse enable signal in parallel.

13. The redundancy circuit of claim 12, wherein the switching element are PMOS or NMOS transistors.

14. The redundancy circuit of claim 13, wherein the switching elements are all NMOS transistors and wherein at least one of the switching elements electrically couples the output signal path of the comparison signal receiving unit to a voltage terminal having a ground voltage level in response to the deactivation of at least one of the plurality of the comparison signals and the fuse enable signal.

15. The redundancy circuit of claim 13, wherein the switching elements are all PMOS transistors and wherein at least one of the switching elements electrically couples the output signal path of the comparison signal receiving unit to a voltage terminal having a power supply voltage level in response to the deactivation of at least one of the plurality of the comparison signals and the fuse enable signal.

16. The redundancy circuit of claim 10, wherein the comparison signal receiving unit is in a floating state when the fuse enable signal and the plurality of the comparison signals are activated and then received.

17. The redundancy circuit of claim 10, wherein the redundancy control signal generating unit provides an output signal, which corresponds to a voltage level as the redundancy control signal, in response to an activated level of the row address enable signal.

18. The redundancy circuit of claim 17, wherein the voltage level is a ground voltage level or a power supply voltage level of the semiconductor memory apparatus.

19. A redundancy circuit in a semiconductor memory apparatus comprising:
an address comparison unit for comparing a plurality of row address signal to a plurality of fuse address signal and then providing a plurality of comparison signals; and
a redundancy discriminating unit for receiving a fuse enable signal and the plurality of comparison signals and activating a redundancy word line by using a redundancy control signal, which is triggered by a transition timing of a row address enable signal, wherein the redundancy discriminating unit includes:
a comparison signal receiving unit having a plurality of switching elements which are in parallel with each other to receive in parallel the plurality of comparison signals and the fuse enable signal in parallel; and
a redundancy control signal generating unit for providing a redundancy control signal, being triggered by deactivation of the row address enable signal to discriminate an activation of the redundancy word line.

20. The redundancy circuit of claim 19, wherein the comparison signal receiving unit receives the fuse enable signal and the plurality of the comparison signals while the row address enable signal is activated.

21. The redundancy circuit of claim 19, wherein the switching elements of the comparison signal receiving unit are PMOS or NMOS transistors.

22. The redundancy circuit of claim 19, wherein the comparison signal receiving unit is in a floating state when the fuse enable signal and the plurality of the comparison signals are activated and then received.

23. The redundancy circuit of claim 19, wherein the redundancy control signal generating unit comprises:
an inverting unit having switching elements which are selectively turned on and off in response to an activation of the row address enable signal; and
a latch unit to provide the redundancy control signal in response to an output signal of the inverting unit.

24. A redundancy circuit in a semiconductor memory apparatus, comprising:
an address comparison unit comparing a plurality of row address signal to a plurality of fuse address signal and providing a plurality of comparison signals;
a redundancy discriminating unit receiving a fuse enable signal and the plurality of comparison signals and activating a redundancy word line by using a redundancy control signal triggered by a transition timing of a row address enable signal;
a redundancy control signal generating unit for providing a redundancy control signal triggered by deactivation of the row address enable signal to discriminate an activation of the redundancy word line.

25. The redundancy circuit of claim 24, wherein the redundancy discriminating unit includes a plurality of switching elements receiving the plurality of comparison signals and the fuse enable signal.

26. The redundancy circuit of claim 25, wherein the plurality of switching elements are in parallel, and receive the plurality of comparison signals in parallel and the fuse enable signal in parallel.

27. The redundancy circuit of claim 25, wherein at least one of the switching elements electrically couples an output signal path of redundancy discriminating unit to a voltage terminal having a ground voltage level in response to the deactivation of at least one of the plurality of the comparison signals and the fuse enable signal.

28. The redundancy circuit of claim 27, wherein the plurality of switching elements include NMOS transistors.

29. The redundancy circuit of claim 25, wherein at least one of the switching elements electrically couples an output signal path of redundancy discriminating unit to a voltage terminal having a power supply voltage level in response to the deactivation of at least one of the plurality of the comparison signals and the fuse enable signal.

30. The redundancy circuit of claim 29, wherein the plurality of switching elements include PMOS transistors.

* * * * *